United States Patent
Chang et al.

(12)

(10) Patent No.: US 6,452,433 B1
(45) Date of Patent: Sep. 17, 2002

(54) HIGH PHASE MARGIN LOW POWER FLIP-FLOP

(75) Inventors: Charles Chang, Newbury Park; Steven Beccue, Oxnard, both of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 90 days.

(21) Appl. No.: 09/583,441

(22) Filed: May 31, 2000

(51) Int. Cl.[7] .............................................. H03K 3/289
(52) U.S. Cl. ........................................ 327/202; 327/201
(58) Field of Search ................................ 327/141, 144, 327/200, 201, 202, 203, 210, 211, 212, 213

(56) References Cited

U.S. PATENT DOCUMENTS

| | | | | |
|---|---|---|---|---|
| 4,918,331 A | * | 4/1990 | Van Zanten et al. | 327/202 |
| 5,189,315 A | * | 2/1993 | Akata | 327/203 |
| 5,259,006 A | * | 11/1993 | Price et al. | 327/141 |
| 5,999,030 A | * | 12/1999 | Inoue | 327/202 |
| 6,064,246 A | * | 5/2000 | Endo et al. | 327/202 |

* cited by examiner

*Primary Examiner*—Matthew Smith
*Assistant Examiner*—Paul Dinh
(74) *Attorney, Agent, or Firm*—Keith Kind; Kelly H. Hale (57) ABSTRACT

An improved flip-flop circuit exhibits a higher phase margin than conventional flip-flop circuits without a substantial increase in operating power. The flip-flop circuit includes a master latch circuit operatively coupled to a slave latch circuit. The flip-flop circuit uses any number of techniques to delay the hold-to-sample transition of the slave latch circuit relative to the sample-to-hold transition of the master latch circuit. The delay enables the flip-flop circuit to better tolerate clock/data timing alignment issues. In a first embodiment, the slave clock signal is delayed relative to the master clock signal. In a second embodiment, the master clock signal buffer is unbalanced such that its duty cycle is skewed to produce unequal sample and hold periods. In a third embodiment, the master latch circuit is unbalanced to create an unequal delay associated with the sampling and holding periods.

22 Claims, 8 Drawing Sheets

HIGH PHASE MARGIN LOW POWER FLIP-FLOP

FIELD OF THE INVENTION

The present invention relates generally to flip-flop circuits. More particularly, the present invention relates to a low power flip-flop having a higher phase margin than conventional flip-flops utilized in digital data recovery circuits.

BACKGROUND OF THE INVENTION

Flip-flop circuits are often utilized in the context of digital data/clock recovery schemes and, particularly, in phase detector arrangements employed in clock recovery circuits. Clock recovery circuits are used to obtain timing information from a digital signal that has been transmitted or communicated without a corresponding clock signal. Consequently, such flip-flop circuits may be used in any number of practical digital applications, e.g., SONET systems, ethernet systems, lightwave communication systems, hard drive reading systems, or the like.

Figure 1:
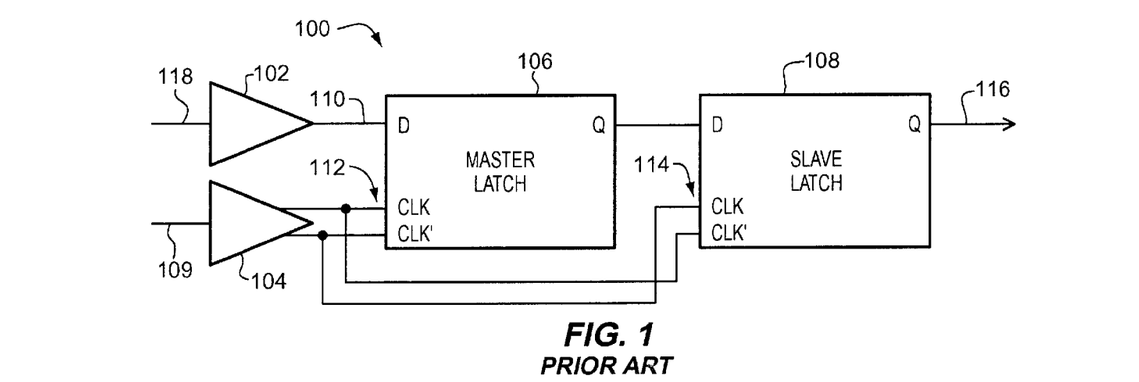
FIG. 1 is a block diagram representation of a prior art flip-flop circuit.

A conventional flip-flop circuit 100 is illustrated in FIG. 1 as a simple block diagram. Flip-flop circuit 100 generally includes an input data buffer 102, an input clock buffer 104, a master latch circuit 106, and a slave latch circuit 108. Input buffers may be employed in such a flip-flop circuit because fan-out and slew rate affects the phase margin at high speeds. The basic operations of flip-flops, buffers, and latches are well known to those skilled in the art. Accordingly, such fundamentals are not described in detail herein. In accordance with known principles, flip-flop circuit 100 generates an output 116 of digital bits in response to an input 1 18 of digital bits and in response to a clock signal 109. Master latch 106 and slave latch 108 sample and hold the digital data in response to a master clock signal 112 and the slave clock signal 114.

Input data buffer 102 and input clock buffer 104 may function as amplifiers to suitably condition a digital input signal 118 and a digital clock signal 109, respectively (for purposes of this description, the various input and output signals are assumed to be digital signals). Input data buffer 102 is connected to a master data input of master latch circuit 106 such that the output of input data buffer 102 is associated with a master data input signal 110. Input clock buffer 104 produces master clock signal 112 (which may include a clock signal and an inverse clock signal), while slave clock signal 114 is in anti-phase with master clock signal 112. The output of master latch circuit 106 is connected to the data input of slave latch circuit 108. Slave latch circuit 108 generates output signal 116 in response to slave clock signal 114. In a practical embodiment, master data input signal 110, the output of master latch circuit 106, and output signal 116 are differential signals (the various figures may represent such differential signals with a single line).

Figure 2:
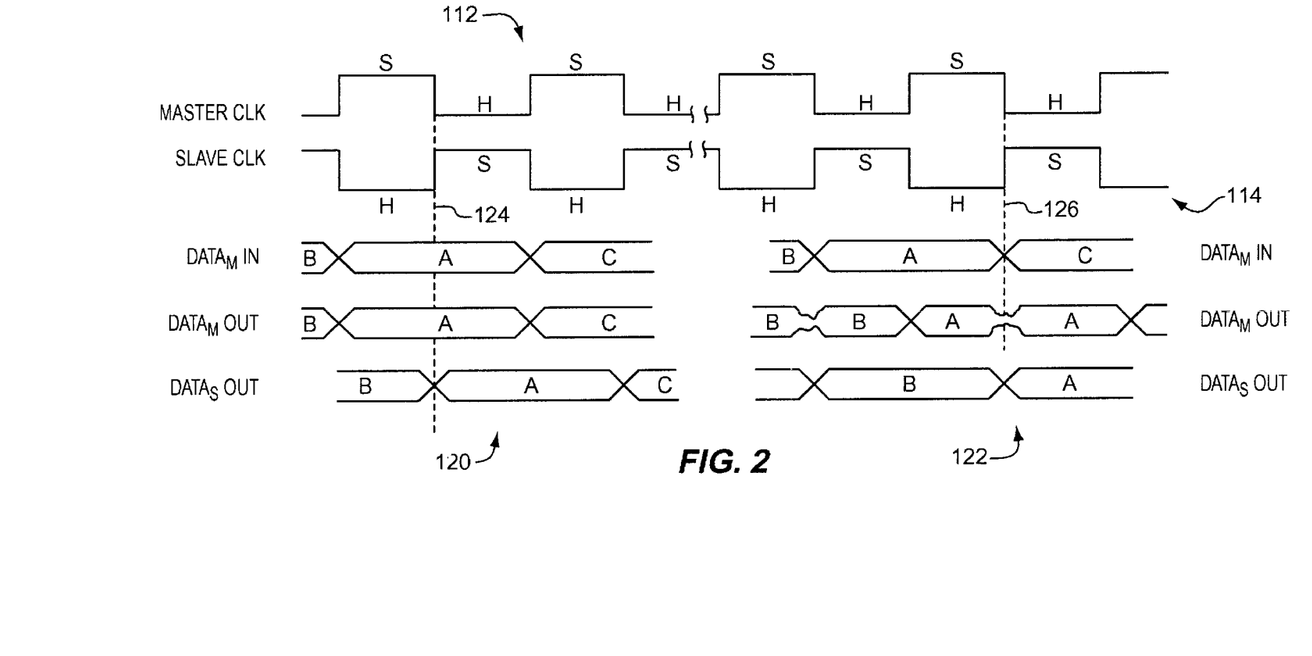
FIG. 2 is a timing diagram illustrating an ideal setup hold alignment and a setup hold violation associated with the flip-flop circuit shown in FIG. 1.

FIG. 2 is a timing diagram that illustrates the sample and hold patterns associated with flip-flop circuit 100. Sample and hold periods for master latch circuit 106 respectively correspond with hold and sample periods for slave latch circuit 108. In flip-flop circuit 100, master latch circuit 106 switches from a sampling state to a holding state in response to the falling edge transition of master clock signal 112. As is well known to those skilled in the art, the differential clock signals enable master latch circuit 106 and slave latch circuit 108 to be clocked out of phase in a practical manner by reversing the positive and negative clock inputs. Similarly, master latch circuit 106 switches from a holding state to a sampling state in response to the rising edge transition of master clock signal 112. Due to the inverse nature of slave clock signal 114 relative to master clock signal 112, slave latch circuit 108 switches from a holding state to a sampling state in response to the falling edge transition of master clock signal 112 (i.e., the rising edge transition of slave clock signal 114) and switches from a sampling state to a holding state in response to the rising edge transition of master clock signal 112 (i.e., the falling edge transition of slave clock signal 114).

A "centered" setup hold data alignment 120 (for maximum decision margin) and a setup hold data alignment violation 122 are depicted in FIG. 2, where it is assumed that the internal flip flop delays are negligible or zero. "DATA$_M$ IN" represents a stream of digital bits (e.g., bit values A, B, and C, where A, B, and C are either ones or zeros) present at the D input to master latch circuit 106. "DATA$_M$ OUT" represents a stream of digital bits present at the Q output of master latch circuit 106. Similarly, "DATA$_S$ OUT" represents a stream of digital bits present at the Q output of slave latch circuit 108. With respect to centered alignment 120, master latch circuit 106 transitions from sample to hold when the current DATA$_M$ IN value (bit A) is well settled, i.e., the input to master latch circuit 106 had plenty of time to settle to the current value near the beginning of the sample period. Thus, when slave latch circuit 108 begins sampling bit A, the output value held at master latch circuit 106 is well before the transition clock edge. The master sample to hold (and slave hold to sample) transition point is indicated by the dashed line 124.

In contrast to centered alignment 120, alignment violation 122 depicts a situation where flip-flop circuit 100 may encounter errors. A setup hold alignment violation may occur if master latch circuit 106 is changing from the sample state to the hold state while the input data is changing. The transition from master latch sample to master latch hold is indicated by the dashed line 126. At this time, the current DATA$_M$ IN value is changing from bit A to bit C. Consequently, the sample to hold transition may encounter a "glitch" because master latch circuit 106 is attempting to hold a bit value that may be changing, which in turn causes the input of slave latch circuit 108 to vary. Such a glitch or imperfection is depicted in the DATA$_M$ OUT pattern proximate transition point 126. If the change in the DATA$_M$ IN bit occurs at (or sufficiently near to) the transition point 126, then an output bit error may result because, in this example, the DATA$_S$ OUT bit can either be bit A or bit C. On the other hand, if the change in the DATA$_M$ IN bit does not occur at the transition point 126, then an output delay may occur while slave latch circuit 108 waits for the bit value at the output of master latch circuit 106 to stabilize. As the transition point 126 approaches the point where the DATA$_M$ IN bit value changes, the output delay increases until, eventually, a bit error occurs.

In addition, because both master latch circuit 106 and slave latch circuit 108 can be transparent (i.e., the latch input appears at the latch output) during the transition 126, the desired output edge of the output signal may be delayed due to finite slew rates. In phase detector applications, where phase information is typically obtained by comparing the input of the master latch to the retimed data (e.g., the output of the master latch), this delay results in a phase measurement error.

The phase margin of flip-flop circuits can be defined as the phase range between the clock and data that does not cause a significant delay of the output relative to the corresponding delay when the clock and data are "centered" (as described above). The setup time can be defined as the time the necessary for the data to be valid before the clock edge transition point, while the hold time can be defined as the time necessary for the data to be valid after the clock edge transition point. In other words, a flip-flop circuit having a large phase margin is able to process data over a larger phase difference range. For example, an arbitrary failure point for a flip-flop circuit may be defined with respect to the increase in the data zero crossing edge displacement relative to the centered sample condition. This value may be designated at, e.g., three picoseconds, for a 10 gigabit per second (Gbps) application. Consequently, if the output delay associated with such an application exceeds the three picosecond limit, then the phase margin of the flip-flop circuit is considered to be violated.

Figure 12:
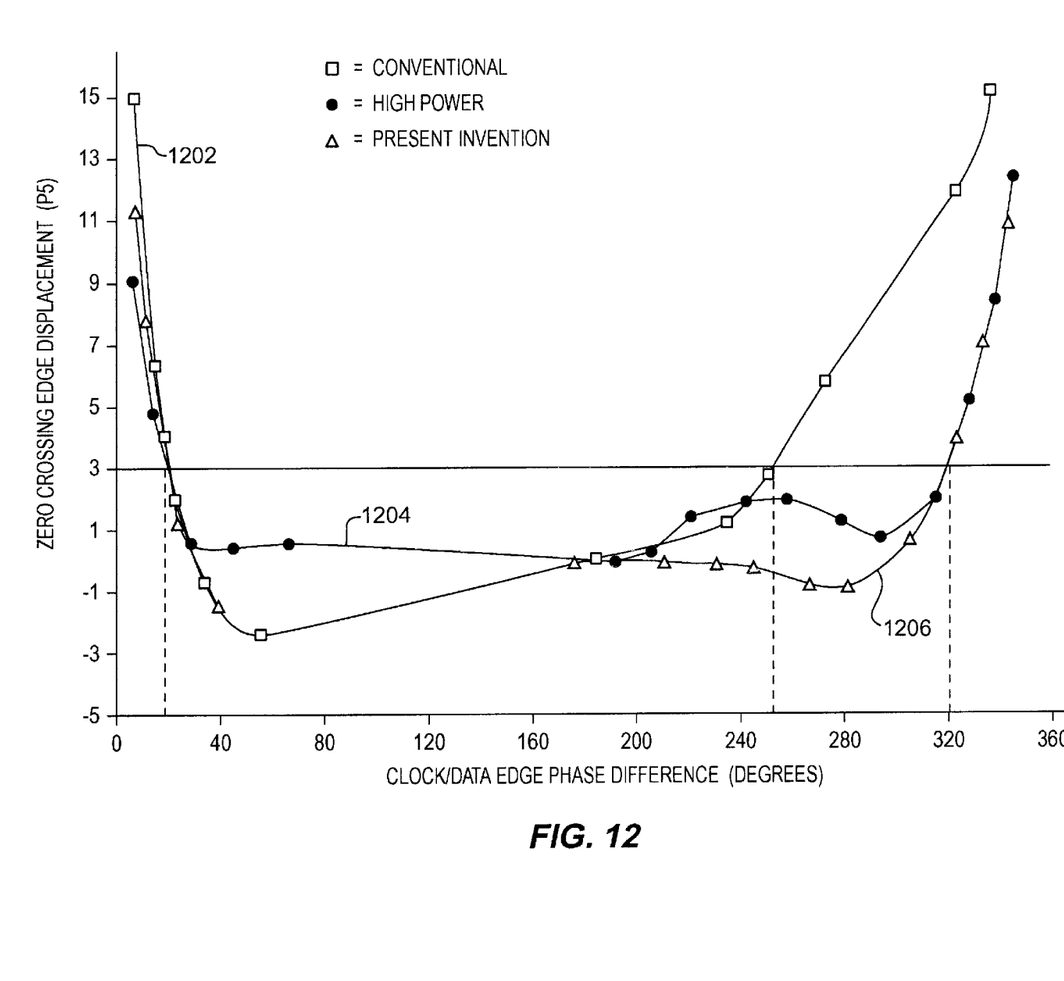
FIG. 12 is a graph depicting the phase margin of several flip-flop circuits.

In a practical embodiment, the centered condition may be considered to be a reference condition where the output delay is minimal or negligible for practical purposes. As the master latch sample to hold transition point moves toward the input data transition point, the output of the slave latch becomes increasingly delayed. Eventually, at a certain relative sample to hold transition point, the output delay exceeds the delay threshold, e.g., three picoseconds. At this point, the phase margin of the device has been exhausted. When the master latch sample to hold transition point coincides with the input data transition point (or when the two are sufficiently close to each other), the output may result in a decision error. For phase detector applications, the output delay criteria may be more stringent than the requirement associated with bit error rate. FIG. 12 depicts phase margin characteristics of several flip-flop circuits. For example, a conventional low power flip-flop circuit (represented by a characteristic plot 1202) may have a phase margin of approximately 228 degrees, relative to a three picosecond edge displacement threshold.

Figure 3:
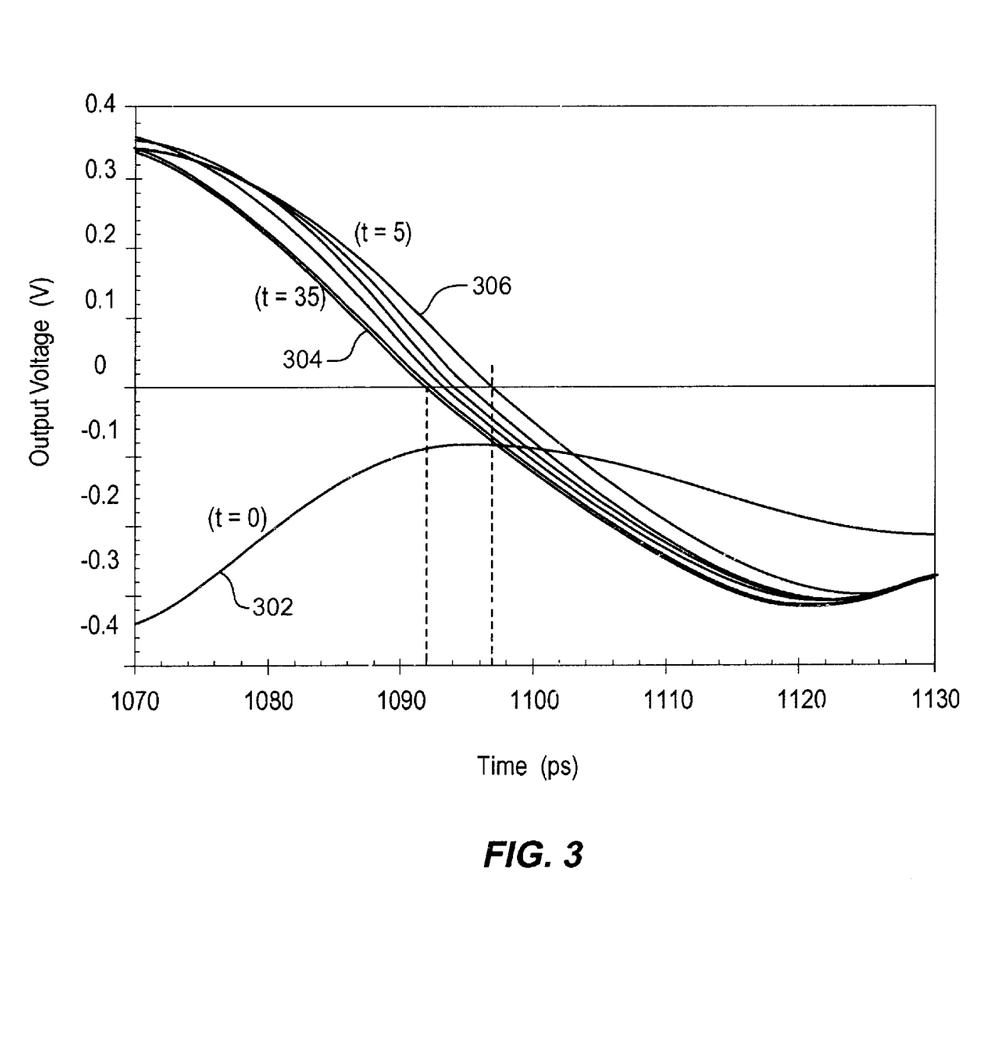
FIG. 3 is a graph of the output of a conventional flip-flop circuit output as a function of different clock and input data phases.

FIG. 3 is a graph that illustrates the phase margin and output delay issues. The vertical scale represents the differential output voltage of a practical flip-flop circuit where positive 0.35 volts represents a logic high and negative 0.35 volts represents a logic low. The output voltage may be a differential voltage generated by a practical latch circuit. The zero voltage value is defined as the logic threshold associated with the digital data. The horizontal scale represents time, in picoseconds. In the context of FIG. 3, the data output is transitioning from a logic high to a logic low; the graph illustrates the shift in the zero output crossover point as a function of clock phase relative to the input data. For a practical 10 Gbps system in which the bit period is only 100 picoseconds the practical tolerable shift in output edge delay is about three to four picoseconds.

At some normalized time, the slave latch of the flip-flop circuit is prompted to change its output from high to low. As time progresses, the output voltage of the flip-flop circuit decreases until it reaches the logic threshold of zero volts. Plot 302 represents the extreme case where the setup/hold time is violated, resulting in a bit error. As shown, no meaningful output change occurs with respect to plot 302. Plot 304 represents the output voltage versus time where the clock is approximately centered in the phase margin of the flip flop circuit. For plot 304, the relatively long setup time enables the master latch input data to be well settled before the master latch switches from the sample state to the hold state (see alignment 120 in FIG. 2). In contrast, a plot 306 represents the output voltage versus time where the setup time approaches the phase margin limit. For plot 306, the relatively short setup time results in an increased amount of output edge delay. When compared to plot 304, the output edge delay associated with plot 306 is approximately five picoseconds (the dashed lines in FIG. 3 identify this time delay). As described above, a five picosecond output delay may be associated with a failure of the flip-flop circuit operating at 10 Gbps.

One prior art solution that increases the phase margin of a flip-flop circuit involves the use of high power transistors in the master latch and/or the slave latch. Higher power transistors are capable of producing faster switching speeds and, therefore, shorter setup and hold times. Consequently, high power flip-flops can tolerate larger phase differences between the sample and hold clock transition relative to the input data transition. Unfortunately, a substantial power "penalty" is imposed to obtain such enhanced flip-flop performance. For example, a conventional flip-flop circuit may require only 80 mW to 100 mW of operating power, while a high power flip-flop circuit may require approximately 500 mW of operating power. This drastic increase in operating power may not be desirable in many practical applications that have limited power budgets and restrictions on the physical size of the flip-flop circuits.

SUMMARY OF THE INVENTION

A flip-flop circuit in accordance with the present invention can be employed in the context of a data/clock recovery circuit such that the adverse effects associated with the lack of tolerance between the input data and the sampling clock phase are reduced. The techniques of the present invention may be used to increase the phase margin associated with conventional flip-flop circuits without a substantial increase in operating power. The increased phase margin of an illustrative flip-flop circuit enables the circuit to perform in an enhanced manner to thereby increase the upper limit on the phase margin, which affects the jitter tolerance specification at high jitter frequencies above the PLL loop bandwidth limit. This results in more linear phase detector transfer curves.

The above and other aspects of the present invention may be carried out in one form by a flip-flop circuit having: a master latch circuit that includes a master data output and a master clock input, where the master latch circuit is configured to switch between a sample state and a hold state in response to a master clock signal present at the master clock input; a slave latch circuit having a slave data input operatively coupled to the master data output and a slave clock input, where the slave latch circuit is configured to switch between a sample state and a hold state in response to a slave clock signal present at the slave clock input; and a delay element configured to produce a timing delay between a sample-to-hold transition associated with the master latch circuit and a hold-to-sample transition associated with the slave latch circuit.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF A PREFERRED EMBODIMENT

The present invention may be described herein in terms of functional block components and various processing steps. It should be appreciated that such functional blocks may be realized by any number of hardware components configured to perform the specified functions. For example, the present invention may employ or be implemented with various integrated circuit components, e.g., memory elements, logic elements, switching elements, timing elements, and the like. In addition, those skilled in the art will appreciate that the present invention may be practiced in conjunction with any number of data transmission and processing schemes and that the circuits described herein are merely illustrative applications for the invention.

It should be appreciated that the particular implementations shown and described herein are merely illustrative and are not intended to limit the scope of the present invention in any way. Indeed, for the sake of brevity, conventional elements, features, and functions of the circuits and systems may not be described-in detail herein. Furthermore, the connecting lines shown in the various figures contained herein are intended to represent exemplary functional relationships and/or physical couplings between the various elements. It should be noted that many alternative or additional functional relationships or physical connections may be present in a practical communication system.

Figure 4:
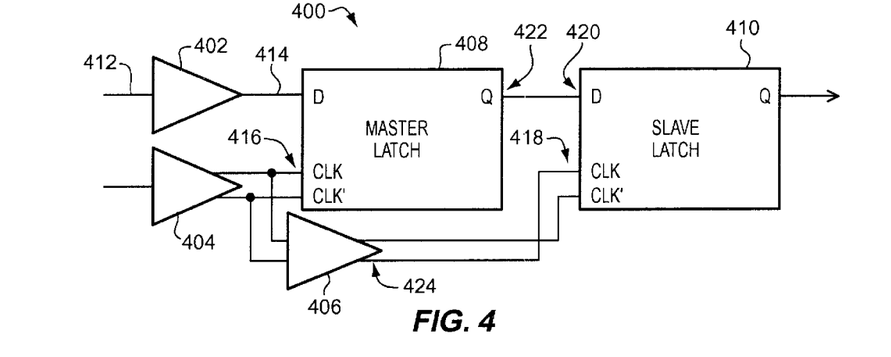
FIG. 4 is a block diagram representation of a flip-flop circuit configured in accordance with the present invention.

FIG. 4 is a block diagram representation of a flip-flop circuit 400 configured in accordance with the present invention. Flip-flop circuit 400 generally includes an input data buffer 402, a first clock signal buffer 404, a second clock signal buffer 406, a master latch circuit 408, and a slave latch circuit 410. Buffers 402 and 404 are included in this embodiment because, as a practical matter, the edge rates of such buffers affects the phase margin of circuit 400. As described above in connection with flip-flop circuit 100, the basic configurations and features of these components are known to those skilled in the art. Accordingly, the fundamental operation of these components will not be described in detail herein.

Input data buffer 402 receives a digital signal 412, e.g., a data bit stream generated at a given bit rate, and produces an output signal 414 in response to the digital signal 412. Although not depicted as such in FIG. 4, digital signal 412 may be formatted as a differential signal having a positive (or non-inverted) component and a negative (or inverted) component. Input data buffer 402 may serve as an amplifier or to otherwise condition digital signal 412. Input data buffer 402 has an output that is operatively associated with the data input of master latch circuit 408 (e.g., the D input of master latch circuit 408). In a practical embodiment, master latch circuit 408 may utilize a non-inverted data input and an inverted data input to facilitate operation in a differential mode.

First clock signal buffer 404 may be configured to generate a master clock signal 416, which may be formatted as a differential signal. In this respect, master latch circuit 408 is shown with a noninverted clock input and an inverted clock input. The output of first clock signal buffer 404 is operatively associated with the clock input to master latch circuit 408. In addition, master clock signal 416 is preferably used as an input to second clock signal buffer 406; second clock signal buffer 406 may be similar in form and function to first clock signal buffer 404. The clock output of second clock signal buffer 406 is operatively associated with the clock input to slave latch circuit 410. Accordingly, a slave clock signal 418 generated by second clock signal buffer 406 is utilized to control slave latch circuit 410. As with master clock signal 416, slave clock signal 418 has a non-inverted component and an inverted component.

As described above, master latch circuit 408 includes a master data input configured to receive the master data input signal 414. Master latch circuit 408 is configured to switch between a sample state and a hold state in response to the master clock signal 416 present at the master clock input. In the embodiment illustrated in FIG. 4, master latch circuit 408 switches from the sample state to the hold state in response to the falling edge of the master clock signal 416. In contrast, master latch circuit 408 is configured to switch from the hold state to the sample state in response to the rising edge of the master clock signal 416.

In the context of flip-flop circuit 400, slave latch circuit 410 may be substantially similar to master latch circuit 408. Slave latch circuit 410 includes a slave latch data input 420 that is operatively coupled to the master data output 422. Slave latch circuit 410 operates in conjunction with a delayed anti-phase clock relative to master latch circuit 408. In the illustrated embodiment, slave latch circuit 410 switches from the sample state to the hold state in response to the falling edge of the slave clock signal 418. In contrast, slave latch circuit 410 is configured to switch from the hold state to the sample state in response to the rising edge of the slave clock signal 418.

In the context of this embodiment, second clock signal buffer 406 functions as a delay element to produce a timing delay between a sample-to-hold transition associated with master latch circuit 408 and a hold-to-sample transition associated with slave latch circuit 410. In this respect, second clock signal buffer 406 is preferably configured to produce the timing delay to thereby increase the phase margin of flip-flop circuit 400, relative to a reference flip-flop circuit having no equivalent timing delay or less timing delay. In a practical embodiment, the propagation delay associated with input data buffer 402 is approximately the same as the propagation delay associated with first clock signal buffer 404. The buffer delay may be dependent upon the specific design of the buffer circuit and the electrical characteristics of the individual components of the buffer circuits In a practical implementation, the buffer delay can range between five and twenty picoseconds for a 10 Gbps application. Second clock signal buffer 406 is configured to delay characteristics of the master clock signal 416 to thereby generate slave clock signal 418 at a delayed clock output 424. Accordingly, slave clock signal 418 is delayed (by the buffer delay associated with second clock signal buffer 406) relative to master clock signal 416.

Figure 5:
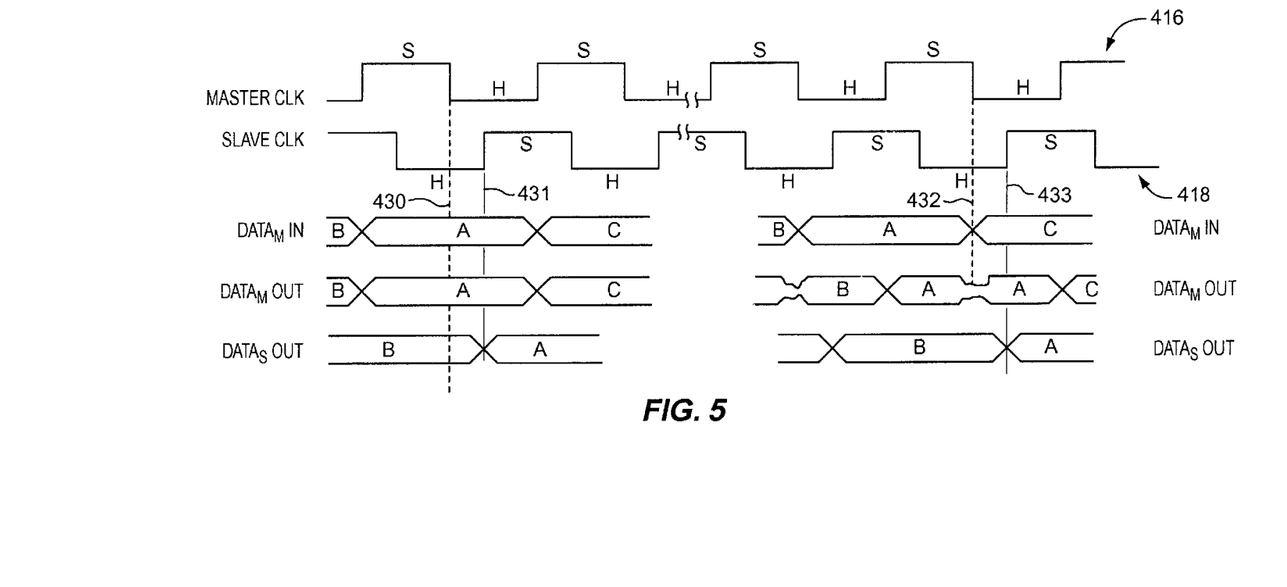
FIG. 5 is a timing diagram illustrating a preferred setup hold alignment and a setup hold "violation" associated with the flip-flop circuit shown in FIG. 4.

FIG. 5 is a timing diagram illustrating the effect of the delayed slave clock signal 418. As shown, characteristics of slave clock signal 418 (produced at the output of second clock signal buffer 406) are delayed relative to master clock signal 416 (produced at the output of first clock signal buffer 404). For purposes of this description, "characteristics" of a clock signal are defined as any detectable, measurable, or actionable attribute that can be used for timing comparisons, phase comparisons, delay comparisons, or the like. For the sake of this example embodiment, the relevant characteristics are the falling edge of master clock signal 416 and the rising edge of slave clock signal 418. The dashed line 430 represents the falling edge of master clock signal 416, i.e., when master latch circuit 408 transitions from the sample state to the hold state. FIG. 5 illustrates that, due to the additional delay introduced by buffer 406, the rising edge of slave clock signal 418 (i.e., when slave latch circuit 410 transitions from the hold state to the sample state) occurs after the falling edge transition of master clock signal 416. Alternatively, the relevant characteristics may be the rising edge of master clock signal 416 and the falling edge of slave clock signal 418, or any suitable reference points associated with the sample and hold periods of master clock signal 416 and slave clock signal 418.

FIG. 5 depicts the timing of the master latch input data (represented by DATA$_M$ IN), the master latch output data (represented by DATA$_M$ OUT), and the slave latch output data (represented by DATA$_S$ OUT) with respect to the timing of master clock signal 416 and slave clock signal 418. The left side of the timing diagram represents an approximately centered data/clock alignment that enables flip-flop circuit 400 to operate in a robust manner (this alignment is akin to the "ideal" alignment illustrated in FIG. 2). As shown, DATA$_M$ IN is well settled at bit A when master latch circuit 408 transitions from the sample state to the hold state. In addition, DATA$_M$ OUT is well settled when slave latch circuit 410 transitions from the hold state to the sample state (this transition point is represented by the solid line 431).

The right side of the timing diagram in FIG. 5 represents a data/clock alignment that can be problematic in prior art flip-flop circuits (this alignment is akin to the alignment violation shown in FIG. 2). As shown, master latch circuit 408 transitions from the sample state to the hold state at the time indicated by the dashed line 432. At this time, the input data is in transition from bit A to bit C. In contrast to the situation depicted in FIG. 2, slave latch circuit 410 does not attempt to immediately sample the changing value present at the input to master latch 408. This gives master latch circuit 408 time to regenerate the sampled data using positive feedback associated with the hold state. Accordingly, the sampling by slave latch circuit 410 is delayed until the value of bit A is stabilized at master latch circuit 408 (the hold to sample transition point for slave latch circuit 410 is represented by the solid line 433). In this manner, the output delay associated with slave latch circuit 410 is reduced. Consequently, the phase margin of flip-flop circuit 400 is significantly increased with only a small amount of additional operating power (the operating power required by second clock signal buffer 406).

The buffer delay associated with second clock signal buffer 406 may be selected in accordance with the particular performance criteria of flip-flop circuit 400. For example, in an illustrative embodiment, the delay of second clock signal buffer 406 is approximately the same as the delay of first clock signal buffer 404. However, the delay between master clock signal 416 and slave clock signal 418 may be undesirable because the output data signal generated by slave latch circuit 410 will be delayed relative to master data input signal 414. Such output signal delay may cause timing problems in phase detector applications that rely on the phase difference between the flip-flop input and output. Although compensation techniques may be employed to handle the output signal delay, such techniques may require additional components and operating power. Furthermore, such compensation techniques may not effectively correct the output signal delay. Nonetheless, the improvement in phase margin due to the addition of a delay element is illustrated by circuit 400.

Figure 6:
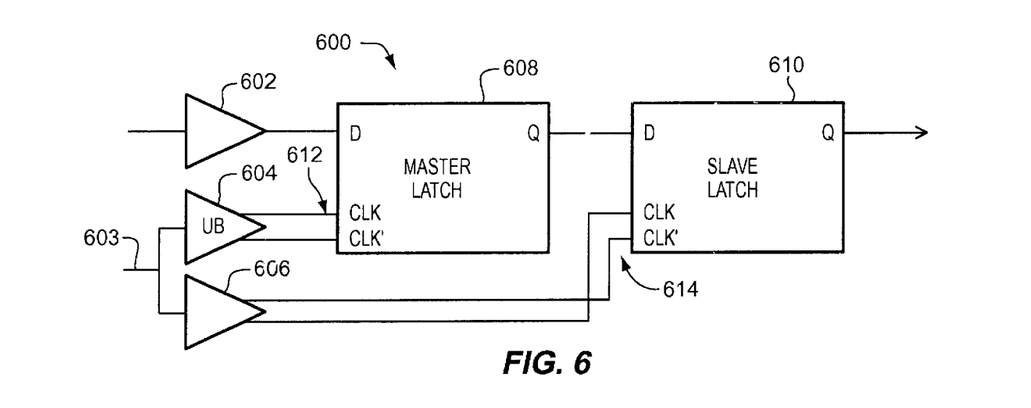
FIG. 6 is a block diagram representation of a flip-flop circuit configured in accordance with the present invention.

FIG. 6 is a block diagram representation of a flip-flop circuit 600 configured in accordance with a preferred embodiment of the present invention. Flip-flop circuit 600 provides the benefits of flip-flop circuit 400 without the inherent output signal delay issue. In addition, the operating power associated with flip-flop circuit 600 is not substantially higher than the operating power associated with conventional flip-flop circuits.

Flip-flop circuit 600 generally includes an input data buffer 602, a master clock signal buffer 604, a slave clock signal buffer 606, a master latch circuit 608, and a slave latch circuit 610. Master clock signal buffer 604 generates a master clock signal 612, while slave clock signal buffer 606 generates a slave clock signal 614. In the preferred embodiment, master clock signal buffer 604 and slave clocks signal buffer 606 receive a common input clock signal 603 from a suitable source. Many of the features, cooperating functions, and characteristics of these components are similar to the equivalent components described above. Accordingly, for the sake of brevity, the description of such common features, functions, and characteristics will not be repeated in the context of flip-flop circuit 600.

Flip-flop circuit 600 is configured such that the duty cycle of master clock signal 612 is skewed relative to the duty cycle of slave clock signal 614. For purposes of this description, a 50% duty cycle (i.e., a non-skewed duty cycle) is associated with a clock signal having approximately equal sample and hold periods, while a skewed duty cycle is associated with a clock signal having different sample and hold periods. It should be appreciated that flip-flop circuit 600 may be alternatively configured such that slave clock signal 614 is skewed relative to master clock signal 612, however, the output phase relationship would change relative to an ideal flip-flop circuit. In other words, the delay issue described above in connection with buffer 406 would be present in such an alternate embodiment. The techniques described below may be equivalently applied in the context of such an alternate embodiment.

Figure 8:
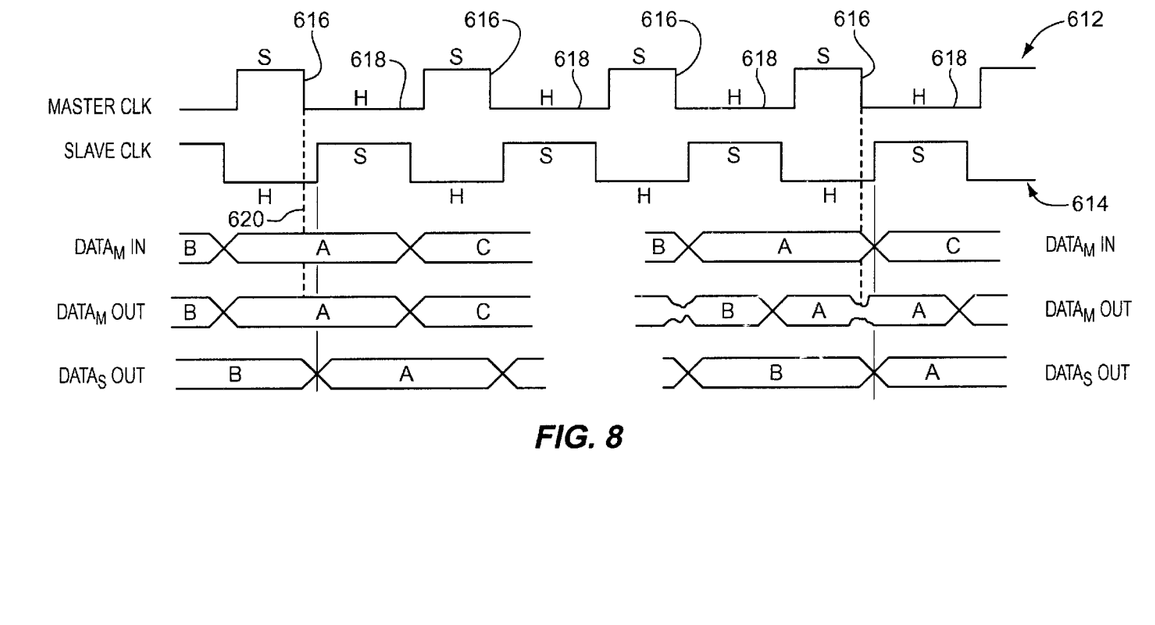
FIG. 8 is a timing diagram illustrating a preferred setup hold alignment and a setup hold "violation" associated with the flip-flop circuit shown in FIG. 6.

Master clock signal 612 and slave clock signal 614 are depicted in FIG. 8 in conjunction with an illustrative data timing pattern. In this example, slave clock signal 614 has a 50% duty cycle and master clock signal 612 has a skewed or unbalanced duty cycle. As shown, the sample periods 616 of master clock signal 612 are shorter than the hold periods 618 of master clock signal 612. The skewed duty cycle effectively produces a timing delay between the sample-to-hold transition associated with master latch circuit 608 (identified by the dashed line 620) and the hold-to-sample transition associated with slave latch circuit 610. As described above in connection with flip-flop circuit 400, this clock transition delay serves to improve the phase margin of flip-flop circuit 600. Indeed, the input and output data timing patterns shown in FIG. 8 are similar in nature to the equivalent timing patters for flip-flop circuit 400 (see FIG. 5). Notably, the skewed duty cycle of master clock signal 612 is accomplished without introducing additional delay to either clock signals. Accordingly, the output data timing of flip-flop circuit 600 remains substantially unaffected.

Figure 7:
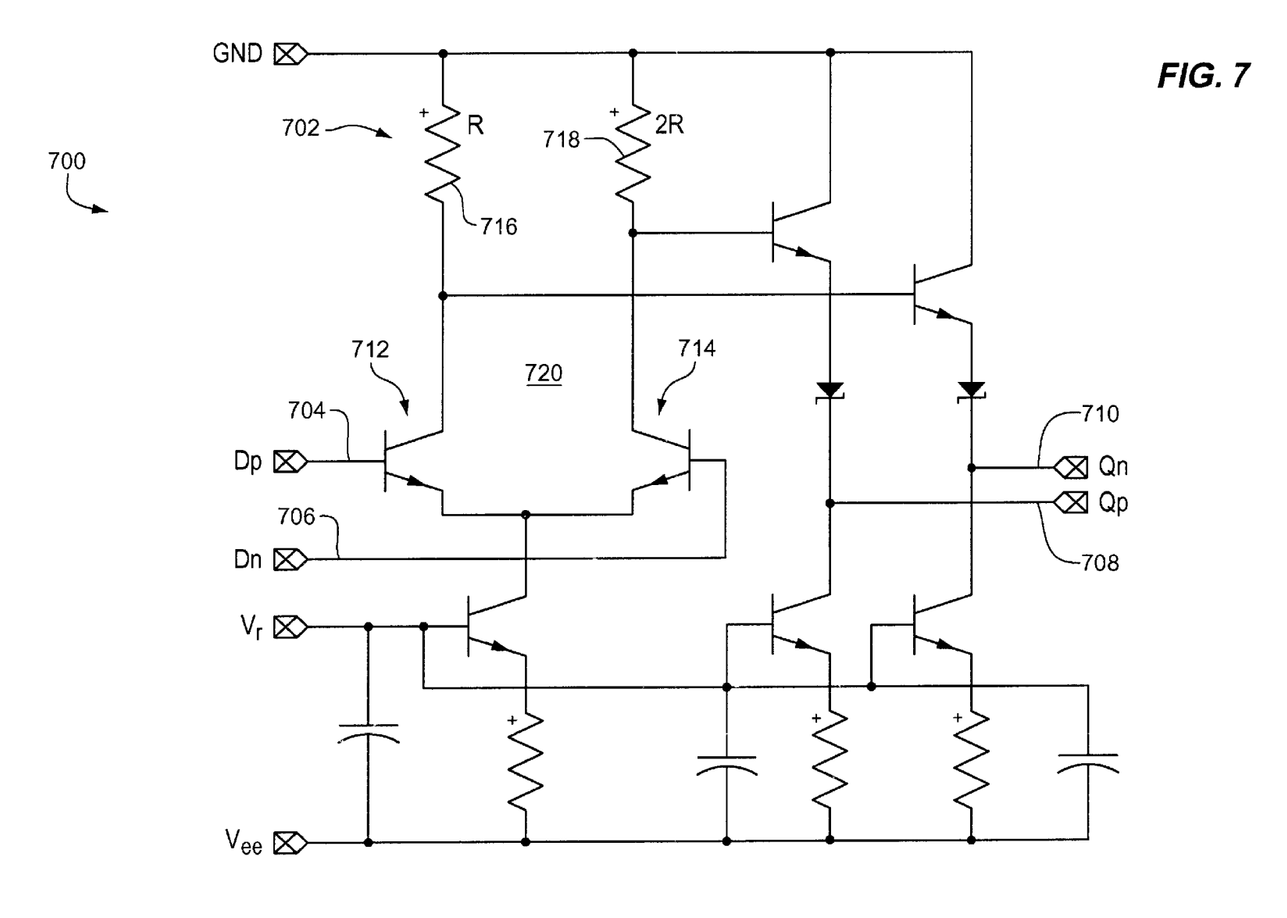
FIG. 7 is a schematic diagram of an unbalanced buffer circuit that may be used in the flip-flop circuit shown in FIG. 6.

FIG. 7 is a schematic of an unbalanced buffer circuit 700 that may be used to realize master clock signal buffer 604. In the context of flip-flop circuit 600, unbalanced buffer circuit 700 may be considered to be a delay element that produces the clock signal timing delay described above. Furthermore, unbalanced buffer circuit 700 may be considered to be an element that skews or changes the duty cycle associated with a clock signal, e.g., master clock signal 612. Buffer circuit 700 preferably includes an unbalancing arrangement 702 for generating a skewed master clock signal.

Figure 9:
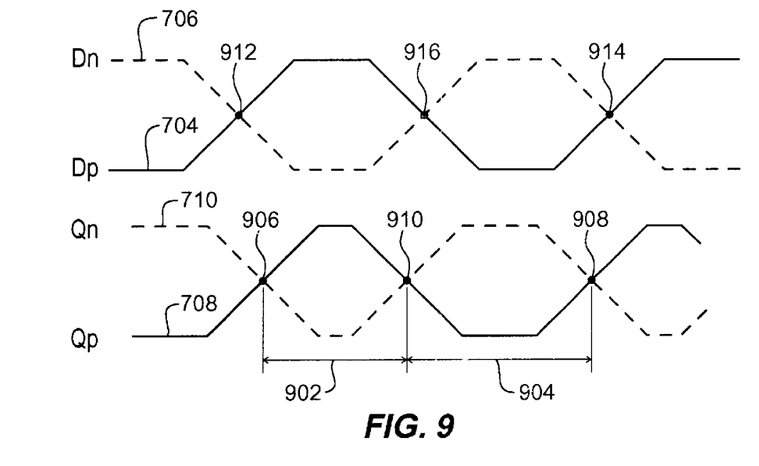
FIG. 9 is a schematic representation of input and output waveforms associated with the unbalanced buffer circuit shown in FIG. 7.

Buffer circuit 700 may be configured as a differential amplifier that receives a positive clock signal input 704 (represented by Dp) and a negative clock signal input 706 (represented by Dn). Buffer circuit 700 generates a positive master clock signal 708 (represented by Qp) and a negative master clock signal 710 (represented by Qn). FIG. 9 is a schematic representation of illustrative input and output waveforms that may be associated with these input and output signals. In FIG. 9, the points where positive master clock signal 708 intersects negative master clock signal 710 represent the sample and hold transitions for circuit 700. For example, points 906 and 908 correspond to transitions from hold to sample, while point 910 corresponds to a sample to hold transition. In contrast, the points where positive clock signal input 704 intersects negative clock signal input 706 can represent the sample and hold transitions for the slave latch, which has a 50% duty cycle. For example, points 912 and 914 correspond to transitions from sample to hold, while point 916 corresponds to a hold to sample transition. These transition points are also shown in FIG. 6 in connection with the clock edges.

Referring back to FIG. 7, buffer circuit 700 includes a differential transistor pair having a first transistor 712 and a second transistor 714. The differential transistor pair responds to the input clock signals in accordance with known techniques to generate the master clock signals. As described in more detail below, for circuit 700 to generate equal voltages for negative master clock signal 710 and positive master clock signal 708, the voltage of positive input clock signal 704 should exceed the voltage of negative input clock signal 706.

In the illustrative embodiment shown in FIG. 7, a first load resistor 716 is operatively coupled to first transistor 712 and a second load resistor 718 is operatively coupled to second transistor 714. In alternate embodiments, any number of additional components may be coupled between the load resistors and the corresponding transistors. First load resistor 716 has a first resistance and second load resistor 718 has a second resistance that differs from the first resistance. For example, a practical embodiment may utilize a 90 ohm first load resistor 716 and a 180 ohm second load resistor 718 to obtain a resultant master clock delay shift of approximately two to five picoseconds. The specific resistor values are not intended to limit the scope of the present invention; a particular flip-flop circuit may employ any suitable load resistor values depending upon the desired duty cycle of the master clock signal.

Assuming that the voltage of signals 710 and 708 is equal, the current flowing through first load resistor 716 will exceed the current flowing through second load resistor 718. It follows that the voltage driving first transistor 712, e.g., positive input clock signal 704, will exceed the voltage driving second transistor 714, e.g., negative input clock signal 706. Accordingly, the crossover points associated with signals 710 and 708 do not correspond to equal voltage crossover points associated with signals 704 and 706; the skewed duty cycle of the master clock signal results from this unbalancing.

Referring again to FIG. 9, the input clock signals 704 and 706 exhibit a 50% duty cycle. However, due to the unbalancing arrangement of buffer circuit 700, the master clock signals 708 and 710 exhibit a skewed duty cycle. As shown, the crossover points associated with master clock signals 708 and 710 define the sampling and hold periods of the master clock signal. Thus, a first period 902 may be associated with the relatively short sampling period of master latch circuit 608 and a second period 904 may be associated with the relatively long holding period of master latch circuit 608 (see FIGS. 6 and 8). It should be appreciated that different resistances may be employed to suitably alter the duty cycle by a desirable amount.

Flip-flop circuit 600 may alternatively (or additionally) implement a second unbalancing arrangement 720 in buffer circuit 700. Second unbalancing arrangement 720 is preferably realized in transistors 712 and 714. In accordance with the present invention, first transistor 712 is characterized by a relative emitter area A1, while second transistor 714 is characterized by a relative emitter area A2, where A2 is greater than A1. The differential emitter areas used in the differential amplifier cause buffer circuit 700 to skew the duty cycle of the master clock signal such that the master clock signal has the general timing characteristics shown in FIG. 9. For a given emitter current, a larger emitter area causes the transistor to operate slower, thus introducing switching delay. The relative emitter sizes of transistors 712 and 714 may be suitably selected to achieve the desired delay characteristics of the master clock signal.

As mentioned above, flip-flop circuit 600 achieves an improvement in the phase margin without introducing a substantial delay in the output data timing. Accordingly, flip-flop circuit 600 may be utilized in many applications with little or no changes to the existing phase detection scheme. Furthermore, the cost in operating power is relatively low in comparison to prior art high power flip-flop solutions- the additional operating power for flip-flop circuit 600 is only associated with the addition of one clock signal buffer. For example, in one practical embodiment, the operating power for flip-flop circuit 600 is approximately 175 mW (the operating power for a conventional low power flip-flop is approximately 95 mW and the operating power for a conventional high power flip-flop is approximately 470 mW).

Figure 10:
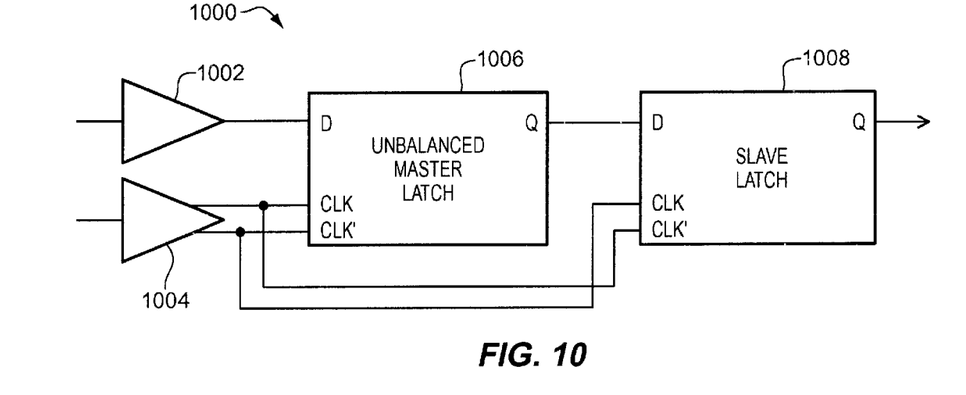
FIG. 10 is a block diagram representation of a flip-flop circuit configured in accordance with the present invention.

FIG. 10 is a block diagram of a flip-flop circuit 1000 configured in accordance with another alternate embodiment of the present invention. Flip-flop circuit 1000 generally includes an input data buffer 1002, a clock signal buffer 1004, an unbalanced master latch circuit 1006, and a slave latch circuit 1008. Many of the features, cooperating functions, and characteristics of these components are similar to the equivalent components described above. Accordingly, for the sake of brevity, the description of such common features, functions, and characteristics will not be repeated in the context of flip-flop circuit 1000. Unbalanced master latch circuit 1006 is configured to function such that the relative sample and hold delays associated with master latch circuit 1006 and slave latch circuit 1008 are unbalanced. The unbalancing of the sample and hold delays produce a timing delay between the sample-to-hold transition of master latch circuit 1006 and the hold-to-sample transition of slave latch circuit 1008.

Figure 11:
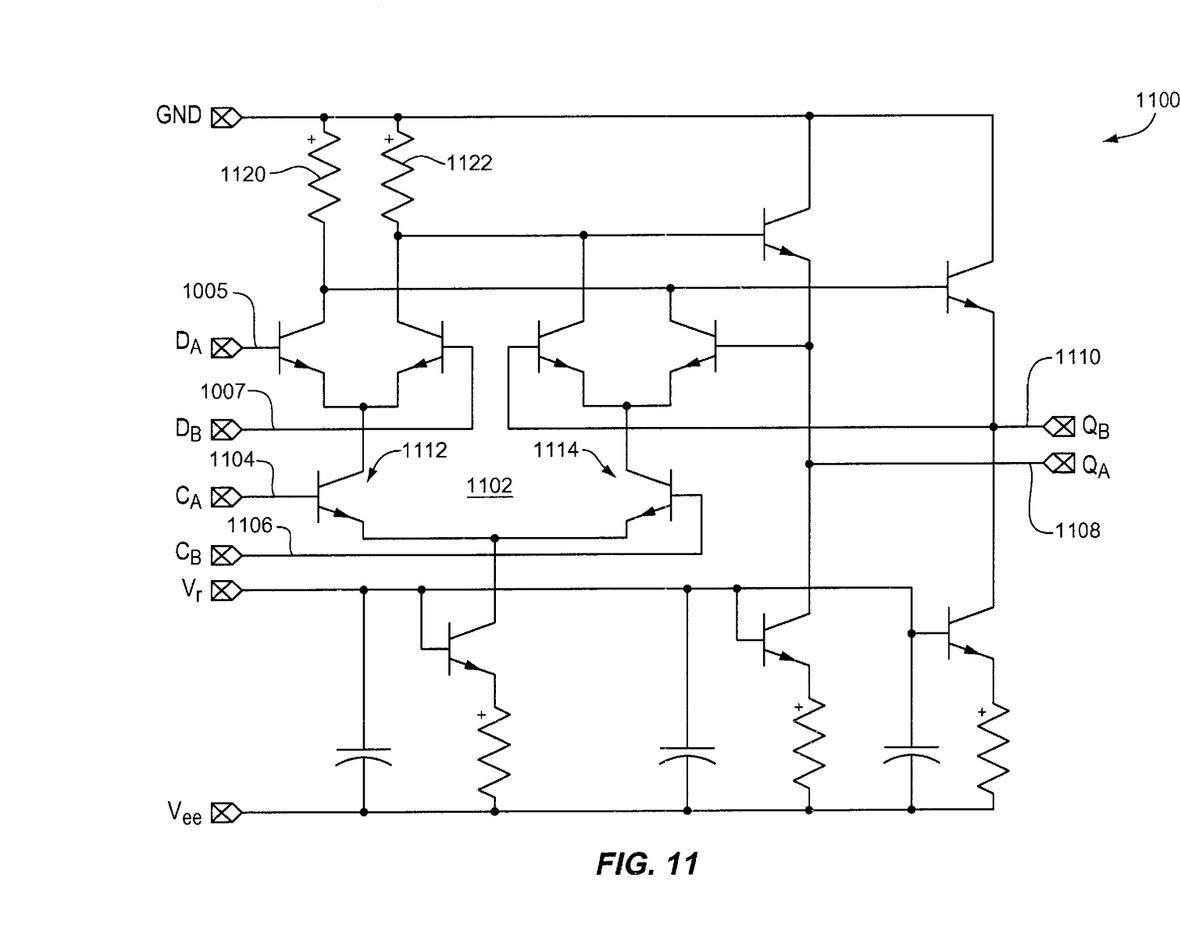
FIG. 11 is a schematic diagram of an unbalanced latch circuit that may be used in a flip-flop circuit according to the present invention.

Referring to FIG. 11, which is a schematic of an unbalanced latch circuit 1100 that may be used in flip-flop circuit 1000, the unbalancing may be realized by a suitable unbalancing arrangement 1102. Unbalanced latch circuit 1100 may function in a differential mode for operation in conjunction with a positive clock signal input 1104 (represented by Ca) and a negative clock signal input 1106 (represented by Cb). Unbalanced latch circuit 1100 receives a positive data input signal 1105 (represented by Da) and a negative data input signal 1007 (represented by Db). Unbalanced latch circuit 1100 generates a positive output signal 1108 (represented by Qa) and a negative output signal 1110 (represented by Qb) in response to the clock signal inputs 1104 and 1106 and in response to the data input signals 1105 and 1107. The differential transistor pair responds to the input clock signals and the input data signals in accordance with known techniques to generate the output data signals that are used as an input to slave latch circuit 1008.

Unbalanced latch circuit 1100 includes a differential transistor pair having a first transistor 1112 and a second transistor 1114. In the illustrated embodiment, unbalancing arrangement 1102 is implemented in first transistor 1112 and/or second transistor 1114. In accordance with the present invention, first transistor 1112 is characterized by a relative emitter area A1, while second transistor 1114 is characterized by a relative emitter area A2, where A2 is greater than A1. In a preferred embodiment of unbalanced latch circuit 1100, area A2 is approximately equal to an integer multiple of area A1, e.g., the emitter area of second transistor 1114 is twice the emitter area of first transistor 1112. In the embodiment shown in FIG. 11, master clock signal 1104 and first transistor 1112 are associated with the sample period, while master clock signal 1106 and second transistor 1114 are associated with the hold period.

The differential emitter areas used in the differential amplifier cause the unbalanced latch circuit 1100 to delay the master sample relative to the slave sample. In the context of circuit 1100, transistors 1112 and 1114 function as buffers/switches. These transistors are connected to the input clock buffer 1004 such that the clock load becomes unbalanced. For a given emitter current, the larger emitter area of second transistor 1114 causes it to operate slower than first transistor 1112, thus introducing the delay. The relative emitter sizes of transistors 1112 and 1114 may be suitably selected to achieve the desired delay characteristics of flip-flop circuit 1000. In this manner, the duty cycle of master latch circuit 1006 may be skewed relative to the duty cycle of slave latch 1008, thus resulting in an improved phase margin.

The unbalanced resistor technique described above in connection with FIG. 7 may also be utilized in the context of unbalanced master latch circuit 1006 (whether in combination with or independent of the differential transistor size feature. In the context of FIG. 11, a first load resistor 1120 may have a different resistance than a second load resistor 1122. As described above, the specific relative resistances can be varied to obtain a suitable delay effect.

Flip-flop circuit 1100 achieves an improvement in the phase margin without introducing a substantial delay in the output data timing (no buffer elements are added). Accordingly, flip-flop circuit 1100 may also be utilized in many applications with little or no changes to the existing phase detection scheme. Furthermore, the cost in operating power is relatively low in comparison to prior art high power flip-flop solutions. For example, in one practical embodiment, the operating power for flip-flop circuit 1100 is only about 140 mW. This operating power can be lower than the operating power associated with the previous embodiment because circuit 1100 need not employ an additional buffer element. However, there may be a slight compromise in flip-flop performance due to the unbalanced clock load.

FIG. 12 is a graph depicting the phase margin of several flip-flop circuits. The vertical scale represents the zero crossing edge displacement of the flip-flop output, in picoseconds. The three picosecond threshold is a defined failure point for purposes of FIG. 12; many high bit rate applications can only tolerate approximately three picoseconds of output edge delay. The horizontal scale represents the phase difference between the clock edge and the input data edge, as described in detail above. A first plot 1202 (identified by the square points) represents the "low-to-high" characteristics of a conventional low power flip-flop circuit that requires approximately 94 mW of operating power. As shown, plot 1202 crosses the three picosecond threshold at about 18 degrees and at about 246 degrees, resulting in a phase margin of approximately 228 degrees. In contrast, a second plot 1204 (identified by the round points) represents the "low-to-high" characteristics of a conventional high power flip-flop circuit that requires approximately 468 mW of operating power. The high power version exhibits an upper phase limit of about 314 degrees, which results in a phase margin of about 296 degrees, i.e., a 68 degree improvement. However, this improvement in phase margin is associated with a substantial increase in operating power.

A third plot 1206 (identified by the triangular points) represents the "low-to-high" characteristics of a flip-flop circuit configured in accordance with the present invention. As described above, practical versions of low power flip-flop circuits 400, 600, and 1000 may utilize about 175 mW, 175 mW, and 140 mW of operating power, respectively. In addition, the phase margins of these low power flip-flop circuits are comparable to the improved phase margin obtained by the conventional high power flip-flop circuit. Accordingly, flip-flop circuits 400, 600, and 1000 may be employed for high speed applications that require improved phase margins without a substantial increase in operating power.

The present invention has been described above with reference to various preferred embodiments. However, those skilled in the art will recognize that changes and modifications may be made to the preferred embodiments without departing from the scope of the present invention. These and other changes or modifications are intended to be included within the scope of the present invention, as expressed in the following claims.

What is claimed is:

1. A flip-flop circuit comprising:
   a master latch circuit having a master data output and a master clock input, said master latch circuit being configured to switch between a sample state and a hold state in response to a master clock signal present at said master clock input;
   a slave latch circuit having a slave data input operatively coupled to said master data output and a slave clock input, said slave latch circuit being configured to switch between a sample state and a hold state in response to a slave clock signal present at said slave clock input, the slave clock signal is an inverted version of the master clock signal; and a delay element configured to produce a timing delay between a sample-to-hold transition associated with said master latch circuit and a hold-to-sample transition associated with said slave latch circuit.

2. A flip-flop circuit according to claim 1, wherein said delay element is configured to produce said timing delay to thereby increase a phase margin of said flip-flop circuit, relative to a reference flip-flop circuit having less timing delay.

3. A flip-flop circuit according to claim 1, further comprising:
a clock signal buffer having a clock output operatively associated with said master clock input, said clock signal buffer generating said master clock signal at said clock output; wherein
said delay element is configured to delay characteristics of said master clock signal to thereby generate a delayed slave clock signal at a delayed clock output; and
said delayed clock output is operatively associated with said slave clock input.

4. A flip-flop circuit according to claim 3, further comprising an input data buffer having an output operatively associated with a master data input.

5. A flip-flop circuit according to claim 1, further comprising:
a first clock signal buffer having a first clock output operatively associated with said master clock input, said first clock signal buffer generating said master clock signal at said first clock output; and
a second clock signal buffer having a second clock output operatively associated with said slave clock input, said second clock signal buffer generating said slave clock signal at said second clock output; wherein
said delay element comprises an unbalancing arrangement in at least one of said first and second clock signal buffers, said unbalancing arrangement being configured to unbalance a duty cycle of at least one of said master and slave clock signals.

6. A flip-flop circuit according to claim 5, wherein said first and second clock signal buffers receive a common input clock signal.

7. A flip-flop circuit according to claim 5, wherein said unbalancing arrangement is realized in said first clock signal buffer such that a sample period associated with said master latch circuit exceeds a hold period associated with said master latch circuit.

8. A flip-flop circuit according to claim 5, wherein said unbalancing arrangement is realized in said second clock signal buffer such that a hold period associated with said slave latch circuit exceeds a sample period associated with said slave latch circuit.

9. A flip-flop circuit according to claim 1, wherein said delay element comprises an unbalancing arrangement in at least one of said master and slave latch circuits, said unbalancing arrangement being configured to unbalance sample and hold delays associated with said at least one of said master and slave latch circuits.

10. A flip-flop circuit according to claim 9, wherein said unbalancing arrangement is realized in said master latch circuit such that a sample period associated with said master latch circuit exceeds a hold period associated with said master latch circuit.

11. A flip-flop circuit according to claim 9, wherein said unbalancing arrangement is realized in said slave latch circuit such that a hold period associated with said slave latch circuit exceeds a sample period associated with said slave latch circuit.

12. A flip-flop circuit arrangement comprising:
a master latch circuit having a master data output and a master clock input, said master latch circuit being configured to switch between a sample state and a hold state in response to a master clock signal present at said master clock input;
a slave latch circuit having a slave data input operatively coupled to said master data output and a slave clock input, said slave latch circuit being configured to switch between a sample state and a hold state in response to a slave clock signal present at said slave clock input;
a first clock signal buffer having a first clock output operatively associated with said master clock input, said first clock signal buffer generating said master clock signal at said first clock output;
a second clock signal buffer having a second clock output operatively associated with said slave clock input, said second clock signal buffer generating said slave clock signal at said second clock output; and
an unbalancing arrangement in at least one of said first and second clock signal buffers, said unbalancing arrangement being configured to produce a timing delay between a sample-to-hold transition associated with said master latch circuit and a hold-to-sample transition associated with said slave latch circuit.

13. A flip-flop circuit arrangement according to claim 12, wherein said first and second clock signal buffers receive a common input clock signal.

14. A flip-flop circuit arrangement according to claim 12, wherein said unbalancing arrangement is realized in said first clock signal buffer such that a sample period associated with said master latch circuit exceeds a hold period associated with said master latch circuit.

15. A flip-flop circuit arrangement according to claim 12, wherein said unbalancing arrangement is implemented in said first clock signal buffer, said first clock signal buffer comprising:
a differential transistor pair having a first transistor and a second transistor, said differential transistor pair being responsive to an input clock signal;
a first load resistor operatively coupled to said first transistor, said first load transistor having a first resistance; and
a second load resistor operatively coupled to said second transistor, said second load transistor having a second resistance that differs from said first resistance.

16. A flip-flop circuit arrangement according to claim 12, wherein:
said unbalancing arrangement is implemented in said first clock signal buffer;
said first clock signal buffer comprises a differential transistor pair having a first transistor and a second transistor, said differential transistor pair being responsive to an input clock signal;
said first transistor has a relative emitter area $A1$; and
said second transistor has a relative emitter area $A2$, where $A2$ is greater than $A1$.

17. A flip-flop circuit comprising:
a master latch circuit having a master data output and a master clock input, said master latch circuit being configured to switch between a sample state and a hold state in response to a master clock signal present at said master clock input;
a slave latch circuit having a slave data input operatively coupled to said master data output and a slave clock input, said slave latch circuit being configured to switch between a sample state and a hold state in response to a slave clock signal present at said slave clock input; and an unbalancing arrangement in at least one of said master and slave latch circuits, said unbalancing arrangement being configured to produce a timing delay between a sample-to-hold transition associated with said master latch circuit and a hold-to-sample transition associated with said slave latch circuit.

18. A flip-flop circuit according to claim 17, wherein said master clock signal and said slave clock signal are in anti-phase relative to one another.

19. A flip-flop circuit according to claim 17, wherein said unbalancing arrangement is realized in said master latch circuit such that a sample period associated with said master latch circuit exceeds a hold period associated with said master latch circuit.

20. A flip-flop circuit according to claim 17, wherein:

said unbalancing arrangement is implemented in said master latch circuit;

said master latch circuit comprises a differential transistor pair having a first transistor and a second transistor, said differential transistor pair being responsive to said master clock signal;

said first transistor has a relative emitter area A1; and said second transistor has a relative emitter area A2, where A2 is greater than A1.

21. A flip-flop circuit according to claim 20, wherein A2 is approximately an integer multiple of A1.

22. A flip-flop circuit according to claim 20, wherein A2 is approximately twice the area of A1.

\* \* \* \* \*